(12) United States Patent
Chien et al.

(10) Patent No.: US 11,532,339 B2
(45) Date of Patent: Dec. 20, 2022

(54) METHOD FOR FORMING SEMICONDUCTOR MEMORY STRUCTURE

(71) Applicant: TAIWAN SEMICONDUCTOR MANUFACTURING COMPANY LTD., Hsinchu (TW)

(72) Inventors: Jui-Fen Chien, Taichung (TW); Hanwen Yeh, Hsinchu (TW); Tsann Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 215 days.

(21) Appl. No.: 16/902,218

(22) Filed: Jun. 15, 2020

(65) Prior Publication Data

US 2021/0390992 A1 Dec. 16, 2021

(51) Int. Cl.
  *G11C 11/16* (2006.01)
  *H01L 43/12* (2006.01)
  *H01L 43/02* (2006.01)
  *H01L 27/22* (2006.01)

(52) U.S. Cl.
  CPC .......... *G11C 11/161* (2013.01); *H01L 27/226* (2013.01); *H01L 43/02* (2013.01); *H01L 43/12* (2013.01)

(58) Field of Classification Search
  CPC ..... G11C 11/161; H01L 27/226; H01L 43/02; H01L 43/12
  See application file for complete search history.

(56) References Cited

U.S. PATENT DOCUMENTS

| | | | | |
|---|---|---|---|---|
| 8,619,394 | B1* | 12/2013 | Park | B82Y 10/00 29/603.07 |
| 2013/0234266 | A1* | 9/2013 | Prejbeanu | G11C 11/16 257/421 |
| 2014/0061828 | A1* | 3/2014 | Lim | G11C 11/1659 257/421 |
| 2014/0197504 | A1* | 7/2014 | Moriyama | G11C 11/161 257/421 |
| 2019/0122799 | A1* | 4/2019 | Shum | H01F 10/3286 |

OTHER PUBLICATIONS

Zhongchang Wang et al., Atomic-Scale Structure and Local Chemistry of CoFeB—MgO Magnetic Tunnel Junctions, Nano Lett. 2016, 16, 1530-1536 (Year: 2016).*

* cited by examiner

*Primary Examiner* — Shih Tsun A Chou
(74) *Attorney, Agent, or Firm* — WPAT Law; Anthony King

(57) ABSTRACT

A method for forming a semiconductor memory structure is provided. The method includes following operations. An interlayer is formed over a first ferromagnetic layer, wherein forming the interlayer includes following operations. A first metal film is formed by sputtering a first target material. A first oxygen treatment is conducted to the first metal film to form a first metal oxide film. A second metal oxide film is formed over the first metal oxide film by sputtering a second target material different from the first target material. A second metal film is formed by sputtering a third target material. A second oxygen treatment is conducted to the second metal film to form a third metal oxide film.

20 Claims, 13 Drawing Sheets

METHOD FOR FORMING SEMICONDUCTOR MEMORY STRUCTURE

BACKGROUND

Memories include a hard disk drive, a dynamic random-access memory (DRAM), a static random access memory (SRAM) and a magnetoresistive random access memory (MRAM). With increasing use of portable computing devices and wireless communication devices, there is a need for the memories featuring greater density, lower power consumption, and/or non-volatile properties. The MRAM may be able to satisfy the aforementioned technical requirements.

The MRAM includes a magnetic tunnel junction (MTJ) element exhibiting a tunnel magnetoresistance (TMR) effect. The MTJ element typically includes a metallic oxide sandwiched between ferromagnetic films, which acts as a tunnel barrier layer (TBL) allowing conduction electron to tunnel through it for producing the desired TMR effect. In order for the MTJ element to perform proper read and write behaviors, TBL must exhibit good adhesion and induce good perpendicular magnetic anisotropy (PMA) with its neighboring ferromagnetic films at two oxide/metal interfaces to avoid peeling-off, a low pinhole density to minimize electrical shorting, and a nearly stoichiometric ratio of oxygen to metal atoms to maximize the TMR effect.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
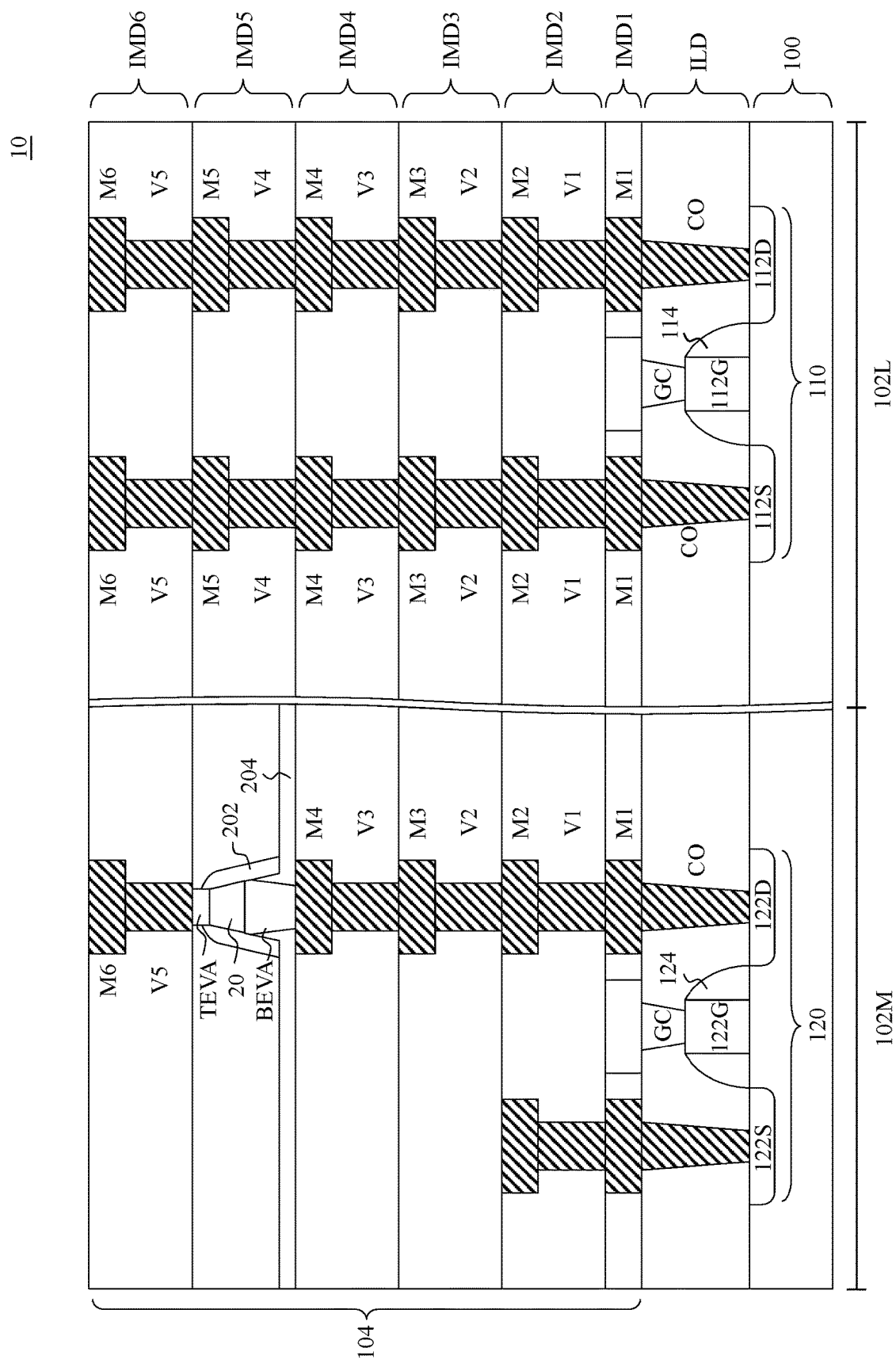
FIG. 1 is a schematic drawing illustrating a semiconductor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A semiconductor memory, such as a magnetic random-access memory (MRAM), may include an array of densely-packed MRAM cells. In each MRAM cell, a data-storage element, such as a magnetic tunneling junction (MTJ) element, may be integrated with a transistor to perform write and read operations. The MTJ element may be fabricated by patterning a MTJ stack disposed between a bottom electrode (BE) and a top electrode (TE) with photolithography. The MTJ stack includes a reference layer and a free layer separated by a tunnel barrier layer (TBL). The reference layer has a fixed magnetization direction, while the free layer has a variable magnetization direction. If the magnetization directions of the reference layer and the free layer are in a parallel orientation (a parallel state), it is easier for conduction electrons to tunnel through the TBL, such that the MTJ stack is in a low-resistance state. Conversely, if the magnetization directions of the reference layer and the free layer are in an antiparallel orientation (an antiparallel state), it is more difficult for conduction electrons to tunnel through the TBL, such that the MTJ stack is in a high-resistance state.

A performance of the MTJ stack is measured by a magnetoresistance (MR) ratio and a resistance area (RA) product. The MR ratio is a ratio of $(R_{ap}-R_p)/R_p$, where $R_{ap}$ is the resistance measured when the magnetizations of the reference layer and the free layer are antiparallel and $R_p$ is the resistance measured when the magnetizations of the reference layer and the free layer are parallel. The RA product is the resistance $R_p$ times the area, where the area is the cross-sectional area of the MTJ stack. The MTJ stack is designed to have a high MR ratio and a low RA product for data storage purpose. The characteristic of the TBL between the reference layer and the free layer is crucial to the performance of the MTJ stack. Specifically, the interface between the reference layer and the TBL or the interface between the TBL and the free layer may play an important role in providing better perpendicular magnetic anisotropy (PMA). When forming the MTJ stack, a reference layer, a TBL, and a free layer may be sequentially formed. It is crucial for lower metal/oxide and upper oxide/metal interfaces to exhibit good adhesion and induce strong PMA, and for the TBL to have a low pinhole density and a nearly stoichiometric ratio of oxygen to metal atoms.

The present disclosure provides a method for forming a semiconductor memory structure. In some embodiments, the present disclosure provides a method for forming a TBL of an MTJ element. Before an RF sputter-deposition of a metallic oxide film, a metallic film is formed over a ferromagnetic film by a DC sputter-deposition followed by a light oxygen treatment. The metallic film is preferably continuous in order to create a metal/metal interface with the underlying ferromagnetic film, thereby ensuring good adhesion and prevent the underlying ferromagnetic film from oxygen penetration, thereby maintaining the designed magnetic moment of the reference layer. The oxygen penetration occurs during subsequent oxygen treatment and RF sputter-deposition. The light oxygen treatment ensures an integrated formation of the TBL with a preferred stoichiometric ratio of oxygen to metal, thereby enhancing the PMA of the reference layer, minimizing the pinhole density of the TBL, and increasing the TMR ratio of the MTJ stack.

Alternatively, the present disclosure provides another method for forming semiconductor memory structure. In some embodiments, the present disclosure provides another method for forming a TBL of an MTJ element. After the RF sputter-deposition of the metallic oxide film, a first metallic film is formed by a DC sputter-deposition followed by a heavy oxygen treatment. In some embodiments, a second metallic film is formed over the first metallic film by another DC sputter-deposition. The first metallic film is preferably continuous in order to prevent the underlying RF-sputtered anaerobic metallic oxide film from a direct exposure to oxygen, which substantially deteriorates the TBL and thus decreases the TMR ratio of the MTJ stack. The heavy oxygen treatment ensures a fully integrated formation of the TBL without any residual metal atoms, thereby enhancing its breakdown voltage and further increasing the TMR ratio of the MTJ stack. Excessive oxygen atoms may protect the MTJ element from oxygen dissipations and resulting degradations of the TMR ratio during the patterning process. The second metallic film is preferably continuous in order to provide a metal/metal interface with the overlying ferromagnetic film, thereby ensuring good adhesion, and prevents the overlying free layer from oxygen penetration, thereby maintaining the designed magnetic moment of the free layer.

FIG. 1 is a schematic drawing illustrating a semiconductor structure according to aspects of the present disclosure in one or more embodiments. Referring to FIG. 1, the semiconductor structure 10 may be a MRAM cell. The semiconductor structure 10 includes a substrate 100, which may be formed of commonly-used semiconductor materials such as silicon (Si), silicon germanium (SiGe), gallium arsenide (GaAs), or the like, and may be a bulk substrate or a semiconductor-on-insulator (SOI) substrate. In some embodiments, the substrate 100 may include a plurality of functional regions. For example but not limited thereto, the substrate 100 can include a memory region 102M and a logic region 102L that are defined by isolation structures and are electrically isolated from other functional regions by the isolation structures. The logic region 102L may include circuitry, such as a transistor 110, for processing information received from memory cells and for controlling reading and writing functions of the semiconductor memory. In some embodiments, an access transistor 120 is disposed in the memory region 102M. The transistor 110 in the logic region 102L can include a gate structure 112G, source/drain regions 112S/112D, and spacers 114, but the disclosure is not limited thereto. The access transistor 120 in the memory region 102M can include a gate structure 122G, source/drain regions 122S/122D, and spacers 124, but the disclosure is not limited thereto. For simplicity, components such as gate conductive layers and gate dielectric layers that are commonly formed in integrated circuits are not illustrated herein.

Still referring to FIG. 1, an interlayer dielectric layer ILD is formed over the transistor 110 and the access transistor 120, and contact plugs CO are formed in the interlayer dielectric layer ILD for providing electrical connections between other circuitry/elements and the source/drain regions 112S/112D of the transistor 110, and between other circuitry/elements and the source/drain regions 122S/122D of the access transistor 120. In some embodiments, the gate contact plugs GC are formed in the interlayer dielectric ILD for providing electrical connections between other circuitry/elements and the gate structure 112G of the transistor 110, and between other circuitry/elements and the gate structure 122G of the access transistor 120. In some embodiments, the contact plugs CO and the gate contact plugs GC can include tungsten (W), but other suitable conductive materials such as silver (Ag), aluminum (Al), copper (Cu), AlCu, and the like may also be used or added.

Still referring to FIG. 1, an interconnect structure 104 is disposed over the interlayer dielectric layer ILD. In some embodiments, the interconnect structure 104 includes a plurality of conductive layers. For example, the interconnect structure 104 includes a plurality of metal layers labeled M1 through M6 and a plurality of connecting vias labeled V1 through V5. Further, the metal layers M1 through M6 and the connecting vias V1 through V5 are disposed in a plurality of inter-metal dielectric layers labeled IMD1 through IMD6. The inter-metal dielectric layers IMD1 through IMD6 may provide electrical insulation as well as structural support for the various features during subsequent fabrication operations. In some embodiments, the metal layers M1 through M6 and the connecting vias V1 through V5 can include W, Al, Cu, AlCu, and the like. In some embodiments, the inter-metal dielectric layers IMD1 through IMD6 may be formed of low-κ dielectric material, for example, material with k value lower than about 3.0, or even lower than about 2.5, but the disclosure is not limited thereto.

In some embodiments, the semiconductor structure 10 may include at least a semiconductor memory structure 20 integrated in the interconnect structure 104. The semiconductor memory structure 20 may include a MTJ element. In some embodiments, the semiconductor memory structure 20 can be integrated over the metal layer M4 and in the inter-metal dielectric layer IMD5, but the disclosure is not limited thereto. In other words, the semiconductor memory structure 20 can be integrated over any of the metal layers Mn−1 and in the inter-metal dielectric layer IMDn, where n is a positive integer. In some embodiments, the semiconductor memory structure 20 is disposed in one of the inter-metal layers IMDn and between two metal layers Mn−1 and Mn+1. For example, the semiconductor memory structure 20 can be disposed in the inter-metal layer IMD5, and further between the metal layer M6 and the metal layer M4.

Referring to FIG. 1, the semiconductor memory structure 20 is disposed between and coupled to a top electrode via TEVA and a bottom electrode via BEVA. In some embodiments, the semiconductor memory structure 20 is electrically connected to the connecting via V5 and the metal layer M6 by the top electrode via TEVA, and electrically connected to the metal layer M4 by the bottom electrode via BEVA. In some embodiments, a sum of a height of the connecting via Vn−1 and a height of the metal layer Mn in the inter-metal layer IMDn is substantially the same as a sum of a height of the semiconductor memory structure 20, a height of the top electrode via TEVA and a height of the bottom electrode via BEVA in the same inter-metal dielectric layer IMDn. For example, in an abovementioned embodiment, a sum of a height of the connecting via V4 and a height of the metal layer M5 in the inter-metal layer IMD5 is substantially the same as a sum of a height of the semiconductor memory structure 20, a height of the top electrode via TEVA and a height of the bottom electrode via BEVA in the inter-metal dielectric layer IMD5.

In some embodiments, a sidewall spacer 202 is disposed over sidewalls of the semiconductor memory structure 20. In some embodiments, the sidewall spacer 202 includes silicon nitride ($Si_3N_4$), but the disclosure is not limited thereto. In some embodiments, a dielectric-protection layer 204 may be disposed over the metal layer M4. The dielectric-protection layer 204 may act as an etch stop layer during manufacturing. In some embodiments, the dielectric-protection layer 204 can be made of dielectric material. The dielectric-protection layer 204 may be made of an extreme low-κ dielectric material, for example.

Figure 2:
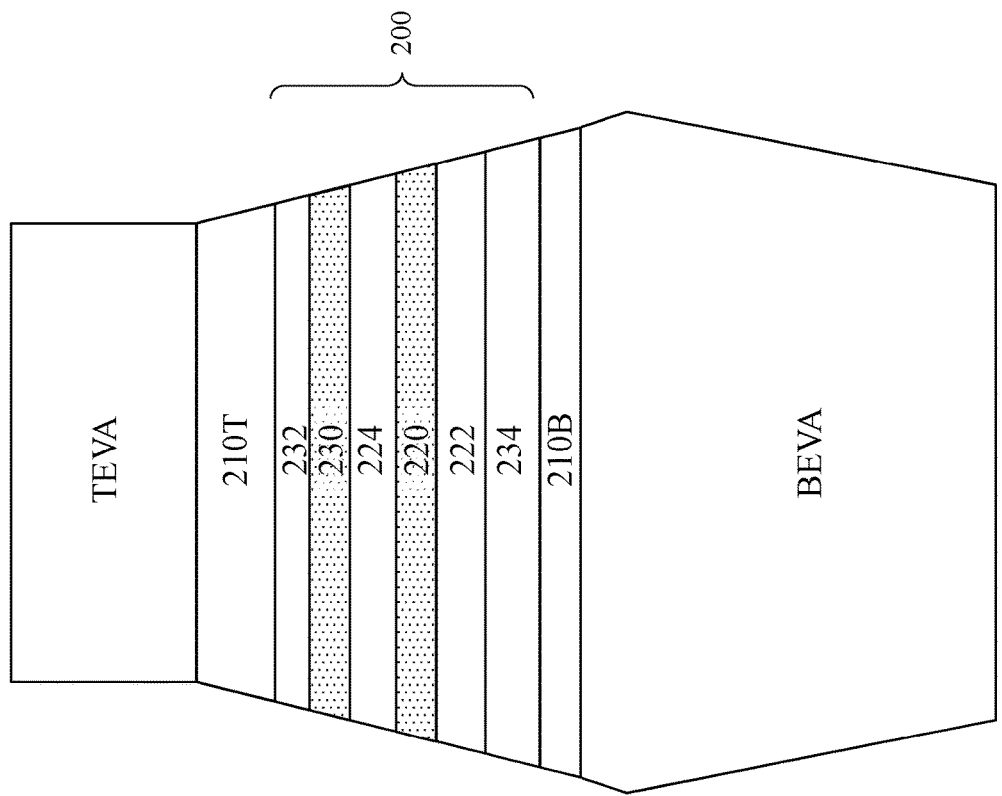
FIG. 2 is a schematic drawing illustrating a semiconductor memory structure according to aspects of the present disclosure in one or more embodiments.

FIG. 2 is an enlarged view of a portion of the semiconductor memory structure 20 according to aspects of the present disclosure in one or more embodiments. Referring to FIG. 2, the semiconductor memory structure 20 includes a bottom electrode 210B, a top electrode 210T and a memory element 200 disposed between the top electrode 210T and the bottom electrode 210B. The top electrode 210T and the bottom electrode 210B are conductive, and may include, for example, metals, metal nitrides, or other suitable conductive materials. For example but not limited thereto, the top electrode 210T and the bottom electrode 210B can include tantalum (Ta), tantalum nitride (TaN), titanium (Ti), titanium nitride (TiN), tungsten (W), tungsten nitride (WN), ruthenium (Ru), platinum (Pt), palladium (Pd), nickel (Ni), nickel chromium (NiCr), zirconium (Zr), or niobium (Nb). In some embodiments, a thickness of the top electrode 210T may be greater than a thickness of the bottom electrode 210B. In some embodiments, the top electrode 210T is formed to a thickness within a range of approximately 60 nanometers to approximately 100 nanometers, but the disclosure is not limited thereto. In some embodiments, the bottom electrode 210B is formed to a thickness within a range of approximately 9 nanometers to approximately 11 nanometers, but the disclosure is not limited thereto.

In some embodiments, the memory element 200 may include, for example, a first ferromagnetic layer 222, a first interlayer 220 overlying the first ferromagnetic layer 222, and a second ferromagnetic layer 224 overlying the first interlayer 220. In some embodiments, the first ferromagnetic layer 222 and the second ferromagnetic layer 224 may be respectively referred to as a reference layer and a free layer. The first ferromagnetic layer 222 has a fixed magnetization direction. The second ferromagnetic layer 224 is capable of changing its magnetization direction between one of two magnetization states, which correspond to binary data states stored in the memory element 200. For example, in a first state, the second ferromagnetic layer 224 can have a magnetization direction parallel to the magnetization direction of the first ferromagnetic layer 222, thereby providing the memory element 200 with a relatively low resistance. In a second state, the second ferromagnetic layer 224 can have a magnetization direction that is antiparallel with the magnetization direction of the first ferromagnetic layer 222, thereby providing the memory element 200 with a relatively high resistance.

In some embodiments, the first ferromagnetic layer 222 can be a multilayered structure comprising ferromagnetic films. For example, the first ferromagnetic layer 222 may include a ferromagnetic iron-boron (Fe—B) film, a nonmagnetic molybdenum (Mo) film and a ferromagnetic cobalt (Co) film. In some embodiments, the Mo film is disposed between the Fe—B film and the Co film to attain a strong perpendicular magnetic anisotropy (PMA), but the disclosure is not limited thereto. In some embodiments, a thickness of the Fe—B film is within a range of approximately 0.8 nanometers to approximately 1.2 nanometers, a thickness of the Mo film is within a range of approximately 0.1 nanometers to approximately 0.35 nanometers, and a thickness of the Co film is within a range of approximately 0.3 nanometers to approximately 0.8 nanometers, but the disclosure is not limited thereto.

In some embodiments, the second ferromagnetic layer 224 can be a multilayered structure comprising ferromagnetic films. For example, the second ferromagnetic layer 224 may include a first ferromagnetic cobalt-iron-boron (Co—Fe—B) film, a nonmagnetic Mo film and a second ferromagnetic Co—Fe—B film. In some embodiments, a thickness of the first Co—Fe—B film is greater than a thickness of the second Co—Fe—B film. In some embodiments, the Mo film is disposed between the first Co—Fe—B film and the second Co—Fe—B film to attain a strong perpendicular magnetic anisotropy (PMA), but the disclosure is not limited thereto. In some embodiments, the thickness of the first Co—Fe—B film is within a range of approximately 1.0 nanometer to approximately 1.4 nanometers, a thickness of the Mo film is within a range of approximately 0.1 nanometers to approximately 0.35 nanometers, and the thickness of the second Co—Fe—B film is within a range of approximately 0.4 nanometers to approximately 0.8 nanometers, but the disclosure is not limited thereto. In some embodiments, a boron atomic percentage in the first Co—Fe—B film is greater than a boron atomic percentage in the second Co—Fe—B film. The first Co—Fe—B film needs a high born content to exhibit a high TMR ratio, while the second Co—Fe—B film needs a low boron content to ensure long data retention.

In some embodiments, the first interlayer 220 may be a tunnel barrier layer (TBL) between the reference layer (i.e., the first ferromagnetic layer 222) and the free layer (i.e., the second ferromagnetic layer 224). The first interlayer 220 may be a dielectric layer. In some embodiments, the first interlayer 220 can include a polycrystalline barrier layer preferably formed of magnesium oxide (MgO) film. In some embodiments, the first interlayer 220 may be formed to a thickness within a range of approximately 0.6 nanometers to approximately 1.2 nanometers. In some embodiments, the first interlayer 220 is thin enough to allow quantum mechanical tunneling of current between the first ferromagnetic layer 222 and the second ferromagnetic layer 224 to exhibit a TMR effect.

In some embodiments, the memory element 200 may further include a second interlayer 230 overlying the second ferromagnetic layer 224. In some embodiments, the memory element 200 may further include a cap layer 232 overlying the second interlayer 230. The second interlayer 230 is disposed between the second ferromagnetic layer 224 and the cap layer 232. The second interlayer 230 may enhance the perpendicular magnetic anisotropy (PMA) of the free layer (i.e., the second ferromagnetic layer 224), and may protect the free layer from degrading when the memory element 200 is built up. In some embodiments, the second interlayer 230 may include a magnesium oxide (MgO) film. In some embodiments, the second interlayer 230 is formed to a thickness within a range of approximately 0.4 nanometers to approximately 0.8 nanometers. In some embodiments, the cap layer 232 may include a multilayered structure comprising a Co—Fe—B film, a first ruthenium (Ru) film, a tantalum (Ta) film and a second Ru film. In some embodiments, a thickness of the Co—Fe—B film is within a range of approximately 0.2 nanometers to approximately 0.4 nanometers, a thickness of the first Ru film is within a range of approximately 2 nanometers to approximately 4 nanometers, a thickness of the Ta film is within a range of approximately 2 nanometers to approximately 4 nanometers, and a thickness of the second Ru film is within a range of approximately 4 nanometers to approximately 8 nanometers, but the disclosure is not limited thereto.

In some embodiments, the memory element 200 may optionally or additionally include a multilayered structure 234 between the first ferromagnetic layer 222 and the bottom electrode 210B. The multilayered structure 234 may optionally or additionally include an antiparallel coupling (APC) layer, a hard-biasing layer (HBL), a seed layer and a ground layer. In some embodiments, the APC layer ensures that the magnetization of the first ferromagnetic layer 222 is antiparallel to that of the hard-biasing layer (HBL) across the APC layer. In some embodiments, the APC layer is made of an iridium (Ir) film formed to a thickness within a range of approximately 0.4 nanometers to approximately 0.6 nanometers. In some embodiments, the HBL comprises laminates of cobalt (Co) and platinum (Pt) films. The Co film has a thickness within a range of approximately 0.2 nanometers to approximately 0.4 nanometers. The Pt film has a thickness within a range of approximately 0.2 nanometers to approximately 0.4 nanometers. In some embodiments, the seed layer may be formed of a ruthenium (Ru) film having a thickness within a range of approximately 4 nanometers to approximately 6 nanometers. In some embodiments, the ground layer may be formed of a tantalum nitride (TaN) layer having a thickness within a range of approximately 1 nanometer to approximately 3 nanometers.

Figure 3:
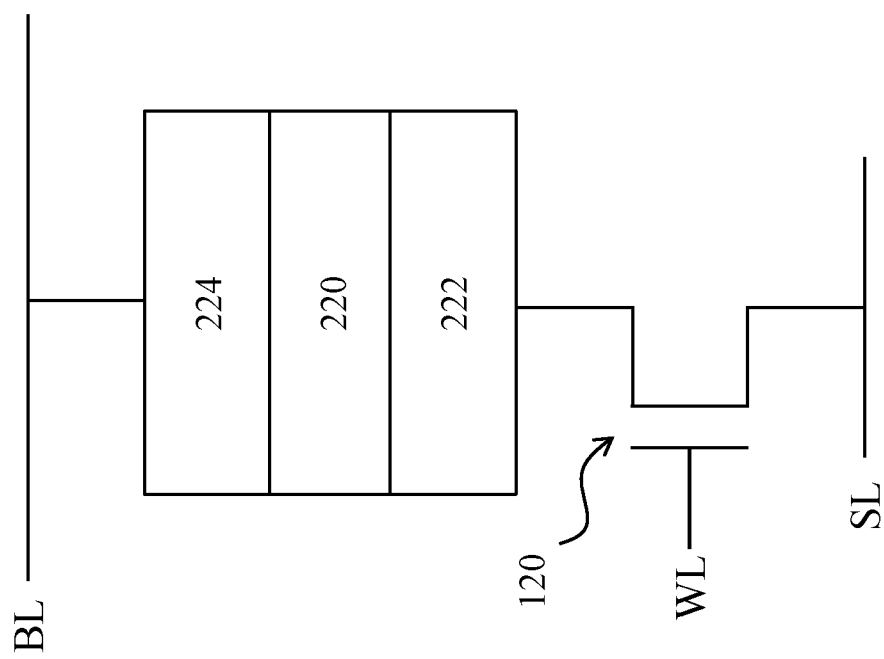
FIG. 3 is a schematic drawing illustrating a circuitry of a semiconductor memory structure according to aspects of the present disclosure in one or more embodiments.

FIG. 3 is a schematic drawing illustrating a circuitry of a semiconductor memory structure according to aspects of the present disclosure in one or more embodiments. A bitline (BL) is coupled to one end of the memory element 200 through the top electrode 210T disposed under a metal wire (not shown). A sourceline (SL) is coupled to an opposite end of the memory element 200 through the access transistor 120. Thus, application of a suitable wordline (WL) voltage to the gate structure 122G of the access transistor 120 couples the memory element 200 between the BL and the SL. Consequently, by providing suitable bias conditions, the memory element 200 can be switched between two states of electrical resistance, a first state with a low resistance (wherein magnetization directions of the first ferromagnetic layer 222 and the second ferromagnetic layer 224 are parallel) and a second state with a high resistance (wherein magnetization directions of the first ferromagnetic layer 222 and the second ferromagnetic layer 224 are antiparallel), to store data.

Figure 4:
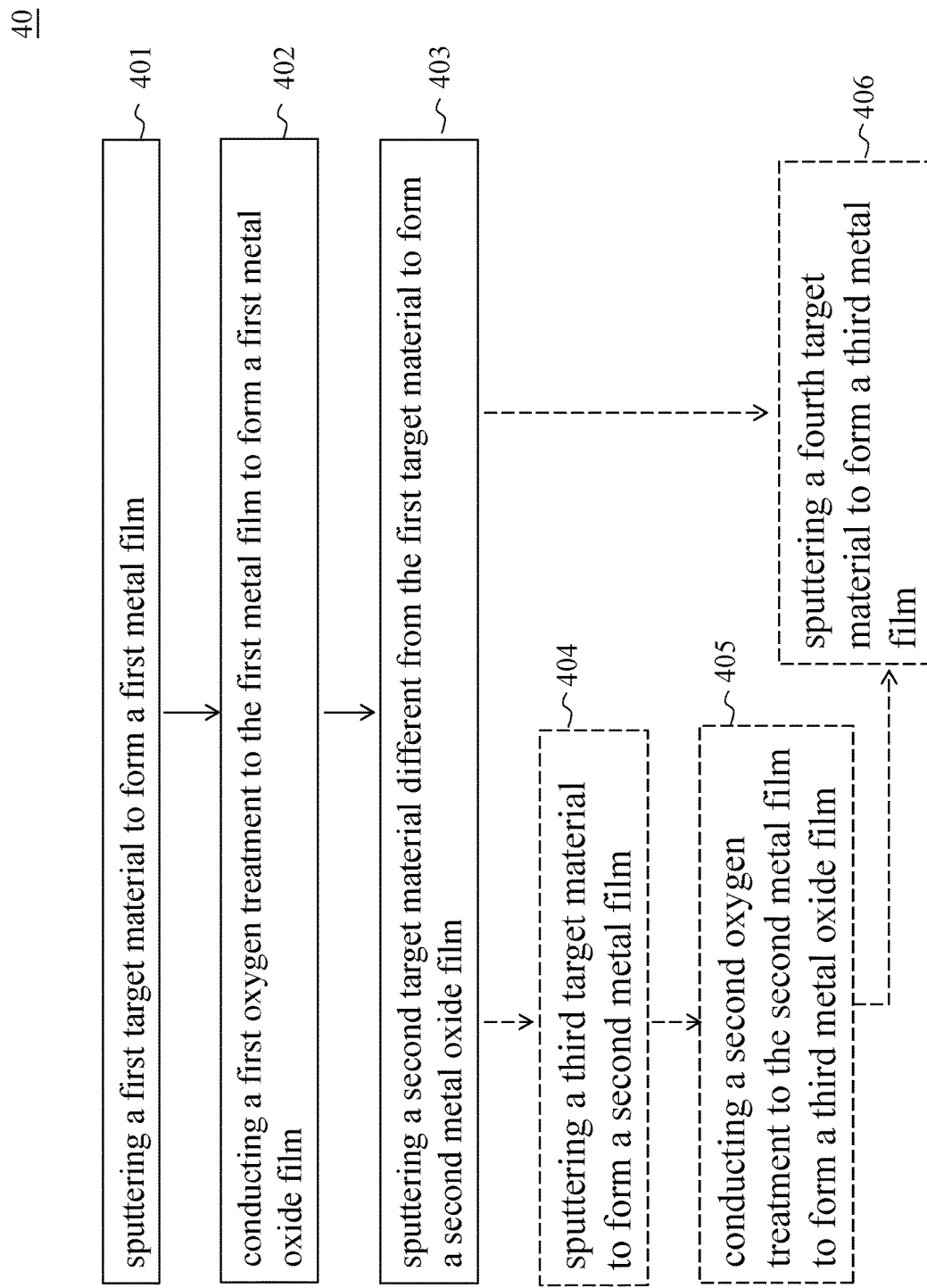
FIG. 4 shows a flowchart representing a method for forming a semiconductor memory structure according to aspects of the present disclosure in one or more embodiments.

The method for forming the memory element 200 of the semiconductor memory structure 20 will be described according to one or more embodiments. FIG. 4 is a flowchart representing a method for forming a semiconductor memory structure 20 according to aspects of the present disclosure. The method 40 includes a number of operations (401, 402, 403, 404, 405 and 406). It should be noted that the operations of the method 40 for forming the memory element 200 of the semiconductor memory structure 20 may be rearranged or otherwise modified within the scope of the various aspects. It should further be noted that additional processes may be provided before, during, and after the method 40, and that some other processes may only be briefly described herein. Thus, other implementations are possible within the scope of the various aspects described herein.

The method 40 for forming the memory element 200 includes forming an interlayer over a ferromagnetic layer. The interlayer can be the first interlayer 220 or the second interlayer 230 as shown in FIG. 2. Further, the ferromagnetic layer can be the first ferromagnetic layer 222 or the second ferromagnetic layer 224 as shown in FIG. 2.

At the operation 401, a first metal film is formed by sputtering a first target material. The first target material may include a metal target. In some embodiments, the first target material may include magnesium (Mg). In some embodiments, the operation 401 may include a DC magnetron sputtering process, wherein the power source is a direct current (DC) power source. In some embodiments, a magnesium film is deposited on a reference layer or a free layer by DC sputtering. In some embodiments, the first metal film has a thickness within a range of approximately 0.12 nanometers to approximately 0.36 nanometers. The first metal film is preferably continuous in order to provide a metal/metal interface with the underlying ferromagnetic layer, thereby ensuring good adhesion, and prevent the underlying ferromagnetic layer from oxygen penetration, which may occur during subsequent oxygen treatment and RF sputter-deposition, thereby maintaining the designed magnetic moment of the underlying ferromagnetic layer.

At the operation 402, a first oxygen treatment is conducted to the first metal film to form a first metal oxide film. In some embodiments, the first oxygen treatment is conducted to the first metal film to oxidize the first metal film to form the first metal oxide film. In some embodiments, the first oxygen treatment is conducted over the magnesium film. In some embodiments, the gas pressure of the first oxygen treatment is preferably ranged from $10^{-5}$ to $10^{-7}$ torr. In some embodiments, the first oxygen treatment is a light oxygen treatment, wherein a flow rate of the first oxygen treatment is within a range of approximately 1 standard cubic centimeter per minute (sccm) to 10 sccm. The first oxygen treatment ensures an integrated formation of the interlayer (e.g., the TBL) with a needed stoichiometric ratio of oxygen to metal, thereby enhancing the PMA of the reference layer, minimizing the pinhole density of the TBL, and increasing the TMR ratio of the MTJ stack.

At the operation 403, a second metal oxide film is formed over the first metal oxide film by sputtering a second target material. The second target material may be different from the first target material. The second target material may include a metal oxide target. In some embodiments, the second target material may include magnesium oxide (MgO). In some embodiments, the operation 403 may include a radio-frequency (RF) sputtering, wherein the power source is an alternating current (AC) power source. In some embodiments, a MgO film is deposited on the first metal oxide film by RF sputtering. In some embodiments, the first metal oxide film may be the lightly oxygen treated Mg film. The memory element 200 of the semiconductor memory structure 20 with the interlayer (e.g., the TBL) formed by operations 401, 402 and 403 exhibits an RA of 7-10 Ω-μm² and a TMR ratio of 160-190%. In some embodiments, the interlayer formed by operations 401, 402 and 403 exhibits a lower RA and a higher TMR ratio compared to a comparative interlayer formed by a single operation 403.

In some embodiments, additional processes may be provided after the operation 403 according to different implementation. At the operation 404, a second metal film is formed by sputtering a third target material. The third target material may include a metal target. In some embodiments, the third target material may include magnesium (Mg). In some embodiments, the operation 404 may include a DC magnetron sputtering process. In some embodiments, a magnesium film is deposited on the second metal oxide film by DC sputtering. In some embodiments, a thickness of the third metal film is less than a thickness of the first metal film. The third metal film is preferably continuous in order to prevent the underlying RF-sputtered anaerobic metallic oxide film from a direct exposure to oxygen during subsequent processes, which substantially deteriorates the TBL and thus decreases the TMR ratio of the MTJ stack.

At the operation 405, a second oxygen treatment is conducted to the second metal film to form a third metal oxide film. In some embodiments, the second oxygen treatment is conducted to the second metal film to oxidize the second metal film to form the third metal oxide film. In some embodiments, the second oxygen treatment is conducted over the magnesium film. In some embodiments, the gas pressure of the second oxygen treatment is preferably ranged from $10^{-3}$ to $10^{-5}$ torr. In some embodiments, the second oxygen treatment is a heavy oxygen treatment, wherein a flow rate of the first oxygen treatment is within a range of approximately 100 sccm to 500 sccm. The heavy oxygen treatment ensures a fully integrated formation of the interlayer (e.g., the TBL) without any residual metal atoms, thereby enhancing its breakdown voltage and further increasing the TMR ratio of the MTJ stack. Excessive oxygen atoms may protect the memory element 200 from oxygen dissipations and resulting degradations of the TMR ratio during the patterning process.

At the operation 406, a third metal film is formed by sputtering a fourth target material. The fourth target material may include a metal target. In some embodiments, the fourth target material may include magnesium (Mg). In some embodiments, the operation 406 may include a DC magnetron sputtering process. In some embodiments, a magnesium film is deposited on the third metal oxide film by DC sputtering. In some embodiments, a thickness of the third metal film and a thickness of the second metal film are substantially the same. In some embodiments, a thickness of the third metal film is less than a thickness of the first metal film. The third metal film is preferably continuous in order to create a metal/metal interface with subsequent overlying ferromagnetic layer (e.g., free layer), thereby ensuring good adhesion, and prevents the overlying ferromagnetic layer from oxygen penetration, thereby maintaining the designed magnetic moment of the overlying ferromagnetic layer. In some embodiments, the operation 406 may be performed after the operation 405. In some embodiments, the operation 406 may be performed directly after the operation 403.

Figure 5B:
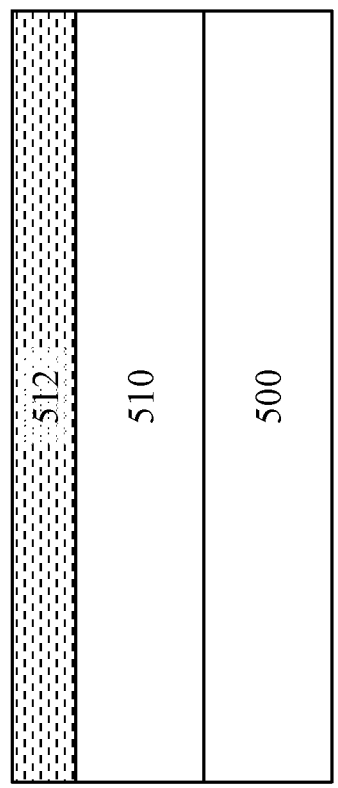
FIGS. 5A to 5H are schematic drawings illustrating a semiconductor memory structure at various fabrication stages constructed according to aspects of the present disclosure in one or more embodiments.
Figure 5A:
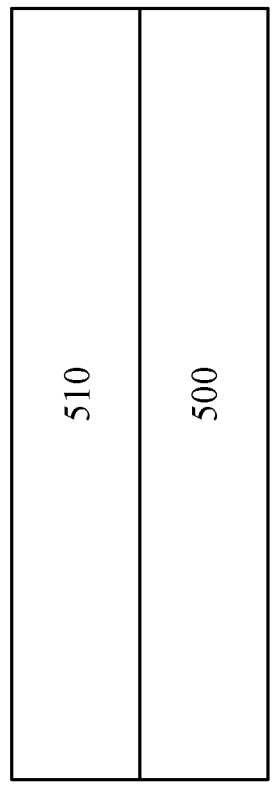

FIGS. 5A to 5H are schematic drawings illustrating a memory element 200 of the semiconductor memory structure 20 at various fabrication stages constructed according to aspects of the present disclosure in one or more embodiments. Referring to FIG. 5A, a first layer 510 may be formed over a base layer 500 before the operation 501. The base layer 500 can be the inter-metal dielectric layer IMD4 as shown in FIG. 1. Further, the base layer 500 can be the metal layer M4 in the inter-metal dielectric layer IMD4. The base layer 500 can be any of the metal layers Mn or the conductive vias Vn−1 in the inter-metal dielectric layer IMDn. In some embodiments, the base layer 500 can be the bottom electrode 210B as shown in FIG. 2. The base layer 500 can be a multilayered structure. In some embodiments, the base layer 500 can be the third interlayer 234 as shown in FIG. 2. In some embodiments, the base layer 500 can be the first interlayer 220 as shown in FIG. 2. Further, the first layer 510 can be a ferromagnetic layer. The first layer 510 formed on the base layer 500 can be the first ferromagnetic layer 222 or the second ferromagnetic layer 224 as shown in FIG. 2.

Referring to FIG. 5B, after the first layer 510 is formed, the operation 401 is performed. A first metal film 512 is formed by sputtering a first target material. The first target material may include a metal target. In some embodiments, the first target material may be sputtered by an inert gas such as argon, krypton or xenon to form the first metal film 512. The first metal film 512 is formed over the first layer 510. In some embodiments, the first metal film 512 is formed to a thickness less than 0.36 nanometers. In some embodiments, the thickness of the first metal film 512 is within a range of approximately 0.12 nanometers to approximately 0.36 nanometers. The thickness of the first metal film 512 is less than 0.36 nanometers so that subsequently introduced oxygen gas may oxidize the first metal film 512.

Figure 5D:
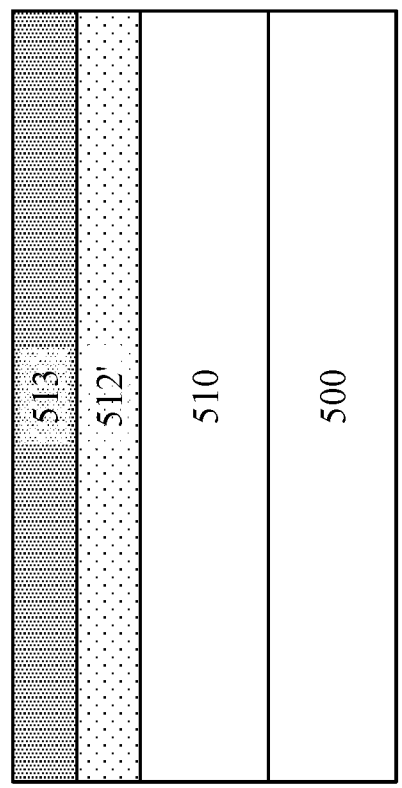
Figure 5C:
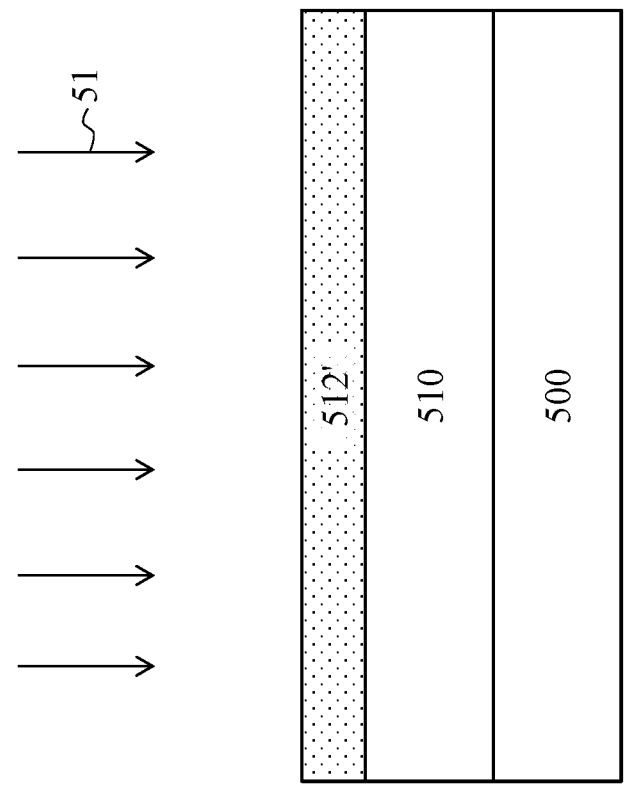

Referring to FIG. 5C, the operation 402 is performed. The first oxygen treatment 51 is conducted to the first metal film 512 to form a first metal oxide film 512'. The oxygen gas is introduced during the first oxygen treatment 51 to form the first metal oxide film 512'. In some embodiments, the duration of the first oxygen treatment 51 is within a range of approximately 10 seconds to approximately 50 seconds. In some embodiments, the flow rate of the oxygen gas of the first oxygen treatment 51 is within a range of approximately 1 sccm to 10 sccm.

In some embodiments, the first metal oxide film 512' may be formed by repeatedly DC sputtering to deposit a first thin metal film over the first layer 510, followed by introducing the oxygen gas to form a first thin metal oxide film, and then DC sputtering to deposit a second thin metal film over the first thin metal oxide film, followed by introducing the oxygen gas to form a second thin metal oxide film. The operations may be repeatedly performed until the first metal oxide film 512' is formed to a suitable thickness.

In some embodiments, the introduced oxygen gas forms a metal-oxygen bond in the first metal oxide film 512', such as an Mg—O bond. The presence of the Mg—O bond ensures the formation of the TBL at the interface with the first layer 510. In some embodiments, the introduced oxygen gas forms another metal-oxygen bond at the interface with the first layer 510, such as a Fe—O bond. The presence of the Fe—O bond ensures the creation of the PMA. In some embodiments, the introduced oxygen gas reacts with the active metal in the first metal film 512, thus reducing the amount of the active metal at the interface between the first layer 510 and the first metal oxide film 512'. Accordingly, the short rate issue can be mitigated.

Referring to FIG. 5D, the operation 403 may be performed after the first metal oxide film 512' is formed. In some embodiments, the operation 403 may include RF sputtering the second target material to form a second metal oxide film 513 over the first metal oxide film 512'. The second target material may include a metal oxide target. In some embodiments, the second metal oxide film 513 is directly formed over the first metal oxide film 512'. The growth mechanism of forming the second metal oxide film 513 differs from that of forming the first metal oxide film 512', thereby suppressing pinhole growth and mitigating the short rate issue.

In some embodiments, elements of the first metal oxide film 512' are substantially same as elements of the second metal oxide film 513. In some embodiments, the oxygen-to-metal ratio of the first metal oxide film 512' is different from the oxygen-to-metal ratio of the second metal oxide film 513. In some embodiments, the oxygen-to-metal ratio of the first metal oxide film 512' is greater than the oxygen-to-metal ratio of the second metal oxide film 513. In some embodiments, a thickness of the first metal oxide film 512' is substantially same as or less than a thickness of the second metal oxide film 513. In some embodiments, the thickness of the second metal oxide film 513 is within a range of approximately 0.6 nanometers to approximately 1 nanometer.

Figure 5F:
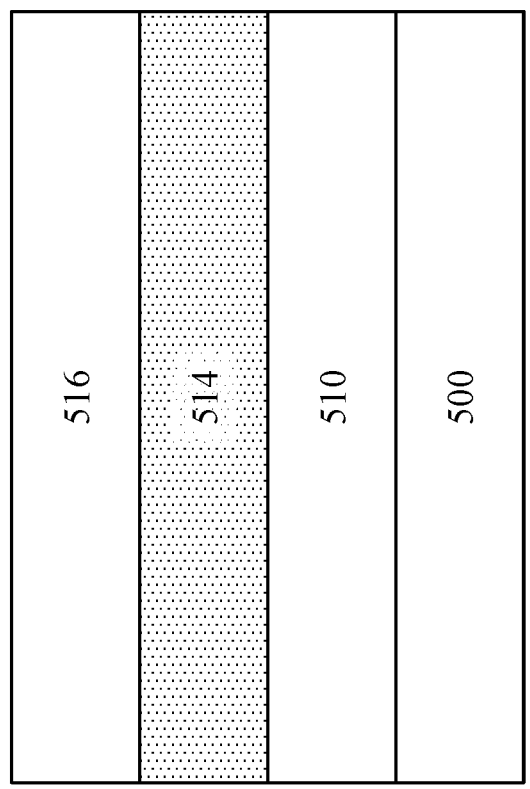
Figure 5E:
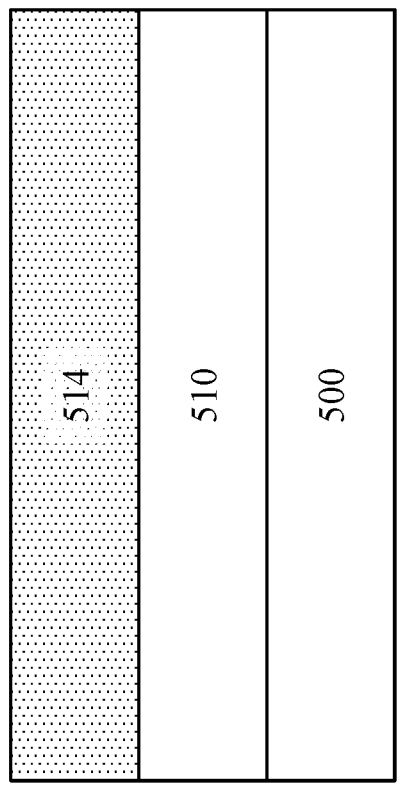

Referring to FIG. 5E, an annealing process may be performed to form the interlayer 514 after the operation 403. In some embodiments, the first metal oxide film 512' and the second metal oxide film 513 are annealed to form the interlayer 514. The annealing process may facilitate a rearrangement of the oxygen atoms and the metal atoms in the first metal oxide film 512' and the second metal oxide film 513. Before the annealing process is performed, the oxygen-to-metal ratio of the first metal oxide film 512' is different from the oxygen-to-metal ratio of the second metal oxide film 513. After the annealing process is performed, the oxygen-to-metal ratio of the first metal oxide film 512' is substantially same as the oxygen-to-metal ratio of the second metal oxide film 513. Thus, the first metal oxide film 512' and the second metal oxide film 513 are merged to form the interlayer 514. The annealing process may be carried out in the same chamber as the operations 401, 402 and 403. For example but not limited thereto, an annealing temperature of the annealing process may be within a range of approximately 300 degrees Celsius to approximately 400 degrees Celsius.

In some embodiments, a cooling process may be performed after the annealing process. For example but not limited thereto, a cooling temperature of the cooling process may be within a range of approximately −110 degrees Celsius to approximately −80 degrees Celsius. The cooling process may alleviate active metal and oxygen atoms at the interface of the interlayer 514 to prevent these atoms from reacting with atoms arriving in the subsequent deposition process, thereby improving TMR effects.

Referring to FIG. 5F, a second layer 516 may be formed over the interlayer 514. In some embodiments, the second layer 516 may be a ferromagnetic layer. The second layer 516 can be the second ferromagnetic layer 224 as shown in FIG. 2. In some embodiments, the second layer 516 can be the cap layer 232 as shown in FIG. 2.

Figure 5H:
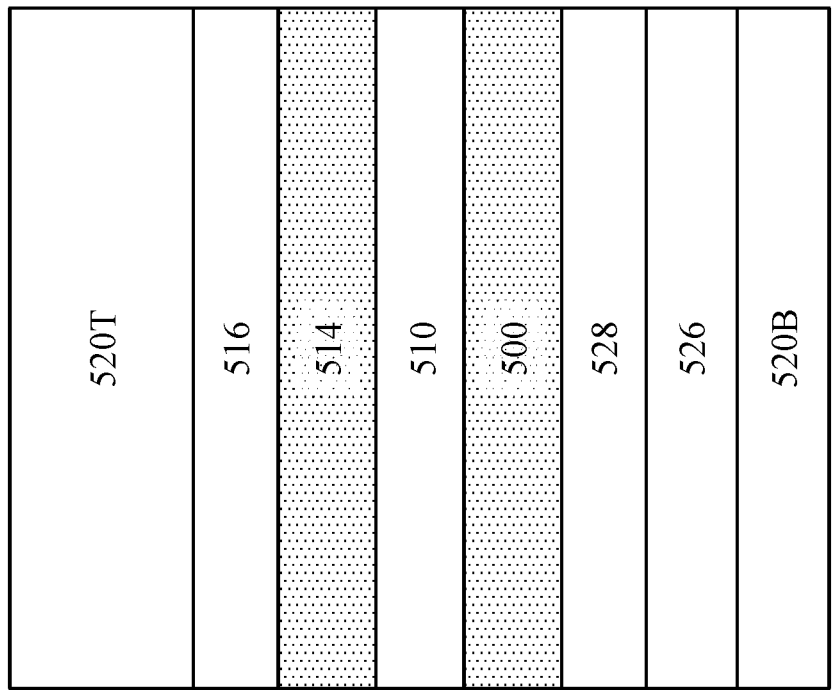
Figure 5G:
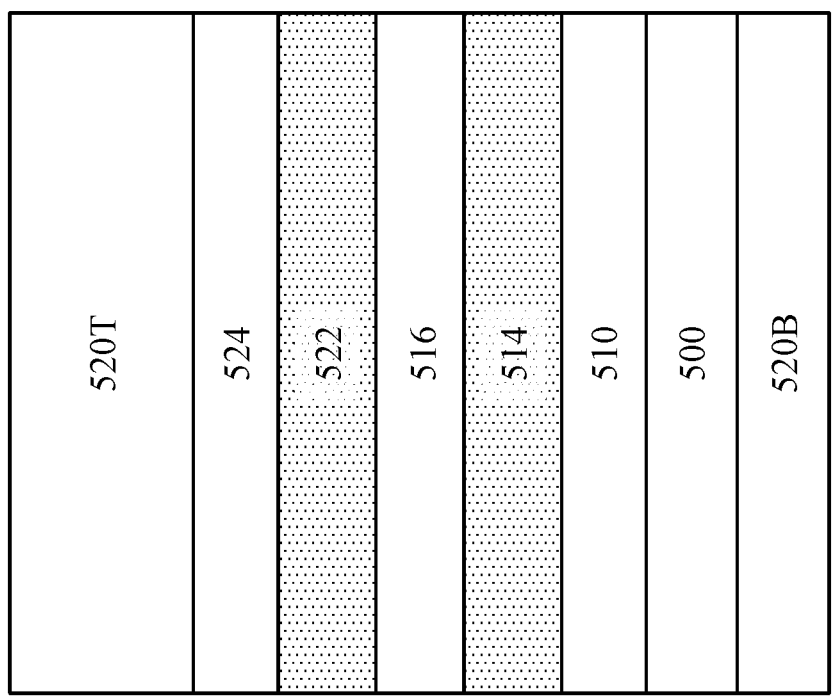

In some embodiments, the interlayer 514 can be the first interlayer 220 as shown in FIG. 2. Referring to FIG. 5G, the base layer 500 and the first layer 510 can be formed over a bottom conductive layer 520B. Further, a second interlayer 522, a cap layer 524 and a top conductive layer 520T may be sequentially formed on the second layer 516. In some embodiments, the second interlayer 522 can be formed by the method 40, but the disclosure is not limited thereto. In some embodiments, a patterned hard mask (not shown) is formed over the stacked layers (i.e., the stack of layers from the bottom conductive layer 520B to the top conductive layer 520T). The stacked layers may be etched through the patterned hard mask to form the memory element 200 of the semiconductor memory structure 20 as shown in FIG. 2, including the patterned bottom conductive layer 520B serving as the bottom electrode 210B, the patterned top conductive layer 520T serving as the top electrode 210T, and the patterned layers 500, 510, 514, 516, 522 and 524 serving as the memory element 200.

Other alternatives or embodiments may be used without departure from the spirit and scope of the present disclosure. In some embodiments, the formation process of the interlayer 514 can be can be used for that of the second interlayer 230 as shown in FIG. 2. Referring to FIG. 5H, a bottom conductive layer 520B, an interlayer 526, and a first ferromagnetic layer 528 may be sequentially formed prior to the formation of the base layer 500. Further, a top conductive layer 520T may be formed on the second layer 516. In some embodiments, a patterned hard mask (not shown) is formed over the stacked layers (i.e., the stack of layers from the bottom conductive layer 520B to the top conductive layer 520T). The stacked layers may be etched through the patterned hard mask to form the memory element 200 of the semiconductor memory structure 20 as shown in FIG. 2, including the patterned bottom conductive layer 520B serving as the bottom electrode 210B, the patterned top conductive layer 520T serving as the top electrode 210T, and the patterned layers 526, 528, 500, 510, 514 and 516 serving as the memory element 200.

Figure 6:
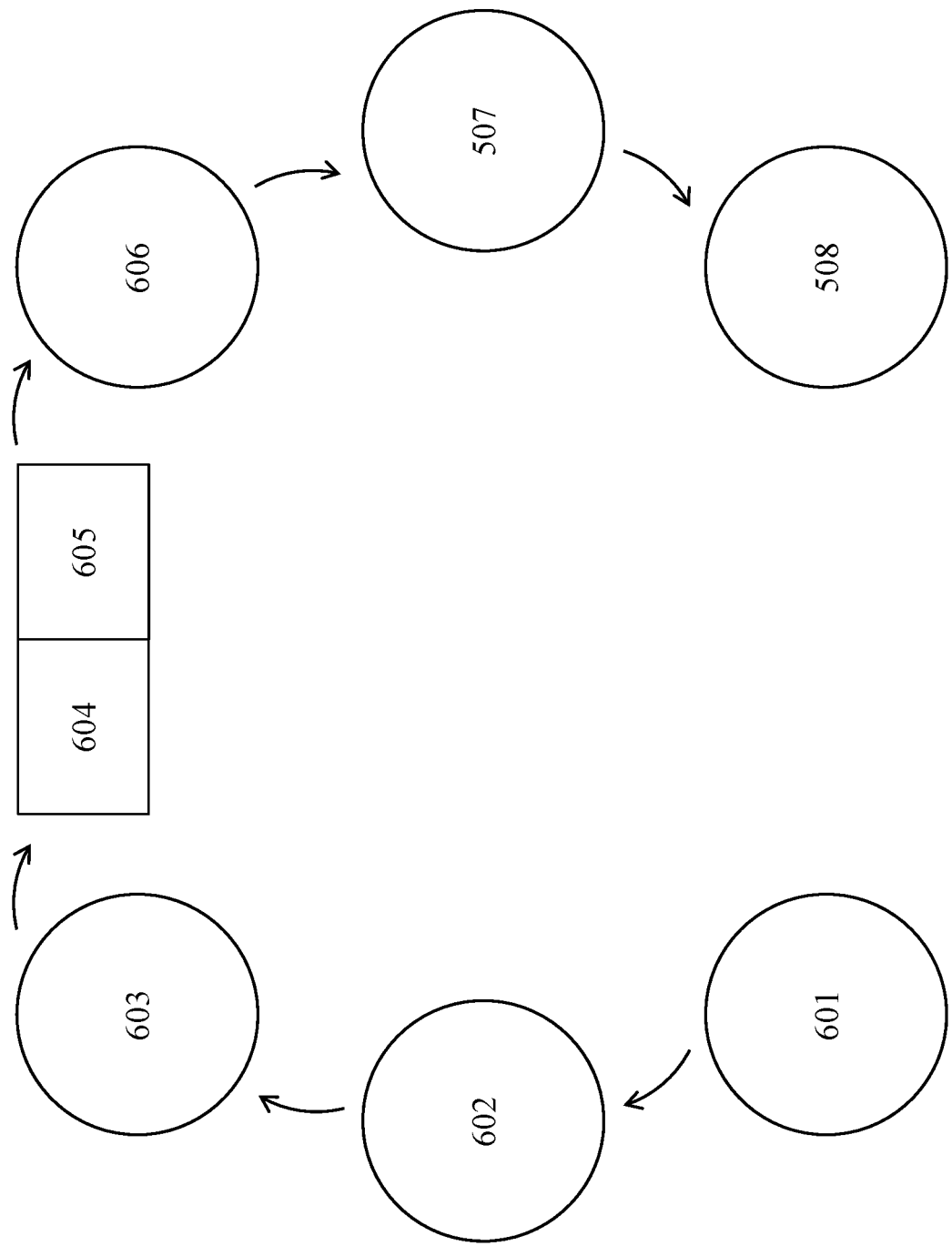
FIG. 6 is a schematic drawing illustrating a tool for forming a semiconductor memory structure according to aspects of the present disclosure in one or more embodiments.

A tool for forming the memory element 200 of the semiconductor memory structure 20 will be further described according to one or more embodiments. FIG. 6 is a schematic drawing illustrating a tool 60 for forming a semiconductor memory structure 20 according to aspects of the present disclosure in one or more embodiments. The tool 60 includes a number of modules (601, 602, 603, 604, 605, 606, 607 and 608). It should be noted that the modules of the tool 60 for forming the memory element 200 of the semiconductor memory structure 20 may be rearranged or otherwise modified within the scope of the various aspects. It should further be noted that additional modules or processes may be provided in addition to the modules or process of the illustrated embodiment of the tool 60, and that some other modules or processes may be only briefly described herein. Thus, other implementations are possible within the scope of the various aspects described herein.

In some embodiments, the modules (601, 602, 603, 604, 605, 606, 607 and 608) in the tool 60 represent different chambers. For example but not limited thereto, each module may represent a chamber for performing a physical vapor deposition (PVD) process. In some embodiments, a number of operations may be performed in a single module (i.e., in a single chamber). For example but not limited thereto, a number of PVD processes may be performed in a same chamber. In some embodiments, multilayers may be formed in the same chamber.

Referring to FIG. 6, at module 601, a bottom conductive layer, such as the bottom conductive layer 520B as shown in FIG. 5G or the bottom electrode 210B as shown in FIG. 2, may be formed. In some embodiments, the bottom conductive layer may be formed by a PVD process. In some embodiments, the module 601 is a PVD chamber for forming the bottom conductive layer. Other processes for forming different layers may be incorporated in the module 601. In some embodiments, a ground layer and a seed layer may be sequentially formed on the bottom conductive layer in the same module 601 (i.e., in the same chamber). The ground layer and the seed layer may be the sublayers of the interlayer 234 as shown in FIG. 2. In some embodiments, the bottom conductive layer, the ground layer and the seed layer may be formed by sputtering a number of target materials. For example but not limited thereto, the target materials may include tantalum (Ta), ruthenium (Ru), molybdenum (Mo), tungsten (W) and copper (Cu).

At module 602, a first ferromagnetic layer, such as the first layer 510 as shown in FIG. 5G or the first ferromagnetic layer 222 as shown in FIG. 2, may be formed. In some embodiments, the first ferromagnetic layer may be formed by a PVD process. In some embodiments, the module 602 is a PVD chamber for forming the first ferromagnetic layer. Other processes for forming different layers may be incorporated in the module 602. In some embodiments, a hard-biasing layer and an APC layer may be sequentially formed in the same module 602 (i.e., the same chamber) prior to the formation of the first ferromagnetic layer. The hard-biasing layer and the APC layer may be the sublayers of the interlayer 234 as shown in FIG. 2. In some embodiments, the first ferromagnetic layer, the hard-biasing layer and the APC layer may be formed by sputtering a number of target materials. For example but not limited thereto, the target materials may include cobalt (Co), platinum (Pt) and iridium (Ir).

At module 603, a first interlayer, such as the interlayer 514 as shown in FIG. 5G or the first interlayer 220 as shown in FIG. 2, may be formed. In some embodiments, the first interlayer may be formed by a PVD process. In some embodiments, the module 603 is a PVD chamber for forming the first interlayer. In some embodiments, the first interlayer may be formed by the method 40 as shown in FIG. 4. In some embodiments, the first interlayer is formed by sputtering a first target material, doping with introduced oxygen gas and sputtering a second target material. In some embodiments, the target materials in the module 603 may include tantalum (Ta), magnesium (Mg) and magnesium oxide (MgO). In some embodiments, the tantalum target is used to deposit a Ta film with a thickness of approximately 16 nanometers on the module wall to prevent and absorb the water vapor in the module 603, thereby improving the purity of the interlayer 514 and enhancing the TMR effects.

At module 604, a heating process (i.e., an annealing process) may be performed after the formation of the interlayer 514. In some embodiments, the annealing process is performed to rearrange the oxygen atoms and the metal atoms in the first metal oxide film 512' and the second metal oxide film 513 as shown in FIGS. 5D and 5E. For example but not limited thereto, a heating temperature of the annealing process may be within a range of approximately 300 degrees Celsius to approximately 400 degrees Celsius. In some embodiments, the heating process may be carried out in a chamber different from the one for depositing the interlayer 514. In some embodiments, the heating process may be carried out in the same chamber as module 603.

At module 605, a cooling process may be performed after the heating process. For example but not limited thereto, a cooling temperature of the cooling process may be within a range of approximately −110 degrees Celsius to approximately −80 degrees Celsius. In some embodiments, the cooling process may be carried out in a chamber different from the module 604. In some embodiments, the cooling process may be carried out in the same chamber as the module 604. In some embodiments, the cooling process may be carried out in the same chamber as module 603.

At module 606, a second ferromagnetic layer, such as the second layer 516 as shown in FIG. 5G or the second ferromagnetic layer 224 as shown in FIG. 2, may be formed. In some embodiments, the second ferromagnetic layer may be formed by a PVD process. In some embodiments, the module 606 is a PVD chamber for forming the second ferromagnetic layer. In some embodiments, the second ferromagnetic layer may be formed by sputtering a plurality of target materials. In some embodiments, the target materials in the module 606 may include cobalt-iron-boron (Co—Fe—B), molybdenum (Mo), magnesium (Mg) and tungsten (W). In some embodiments, the target materials may include a different Co—Fe—B material having a different boron atomic percentage.

At module 607, a second interlayer, such as the second interlayer 522 as shown in FIG. 5G or the second interlayer 230 as shown in FIG. 2, may be formed. In some embodiments, the second interlayer may be formed by a PVD process. In some embodiments, the module 607 is a PVD chamber for forming the second interlayer. In some embodiments, the second interlayer may be formed by the method 40 as shown in FIG. 4. In some embodiments, the second interlayer is formed by sputtering a first target material, doping with introduced oxygen gas and sputtering a second target material. In some embodiments, the second interlayer may be formed by sputtering a plurality of target materials. In some embodiments, the target materials in the module 607 may include tantalum (Ta), magnesium (Mg) and magnesium oxide (MgO).

In some embodiments, the formation of the second interlayer may be carried out in the same chamber as the module 603. Thus, the module 607 may be omitted. For example but not limited thereto, after forming the second ferromagnetic layer at module 606, the processed wafer is transferred back to module 603 for forming the second interlayer. Further, depending on implementation, the processed wafer may undergo the heating module 604 and the cooling module 605 for forming the second interlayer. In some embodiments, the processed wafer may be transferred to module 608 directly after module 603.

At module 608, a cap layer, such as the cap layer 524 as shown in FIG. 5G or the cap layer 232 as shown in FIG. 2, may be formed. In some embodiments, the cap layer may be formed by a PVD process. In some embodiments, the module 608 is a PVD chamber for forming the cap layer. Other processes for forming different layers may be incorporated in the module 608. In some embodiments, a top conductive layer may be sequentially formed in the same module 608 (i.e., the same chamber). The top conductive layer may be the top conductive layer 520T as shown in FIG. 5G or the top electrode 210T as shown in FIG. 2. In some embodiments, the cap layer and the top conductive layer may be formed by sputtering a number of target materials. For example but not limited thereto, the target materials may include cobalt-iron-boron (Co—Fe—B), tantalum (Ta), ruthenium (Ru), titanium (Ti) and tungsten (W).

In some embodiments, the forming of multilayers in the same chamber may reduce the interface between the layers. By combining different operations in a single chamber, the efficiency of manufacturing the memory element 200 of the semiconductor memory structure 20 may be increased. Further, the cost of manufacturing the memory element 200 of the semiconductor memory structure 20 may be reduced. In some embodiments, a wafer including the interconnect structure 104 can be loaded into the tool 60, and operations for forming the abovementioned layers can be performed. In some embodiments, all the layers for forming a memory element 200 can be formed in the same tool 60, and the wafer can be unloaded from the tool 60. Subsequently, operations such as the abovementioned patterning can be performed.

Figure 7B:
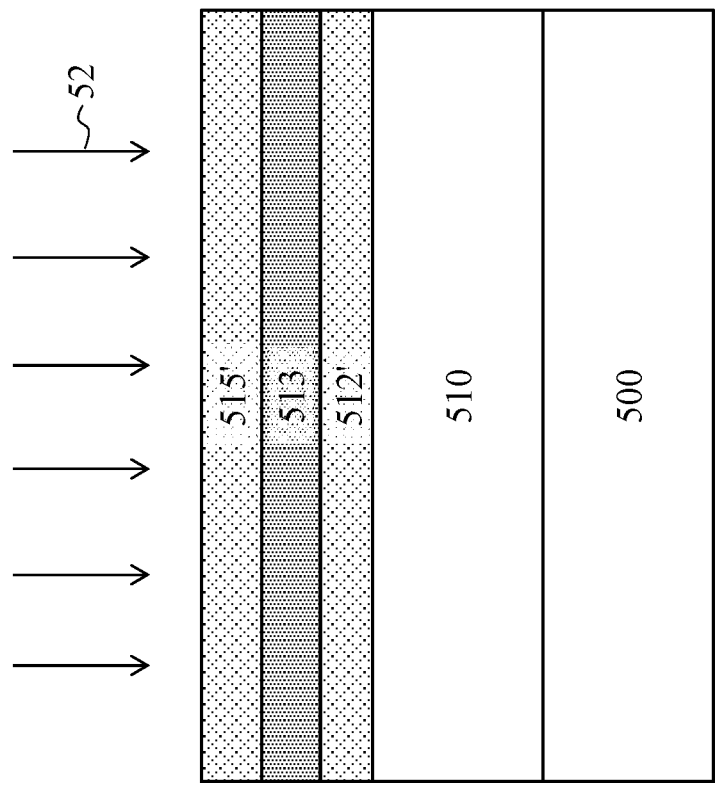
FIGS. 7A to 7C are schematic drawings illustrating a semiconductor memory structure at various fabrication stages subsequent to that illustrated in FIG. 5D according to aspects of the present disclosure in different embodiments.
Figure 7A:
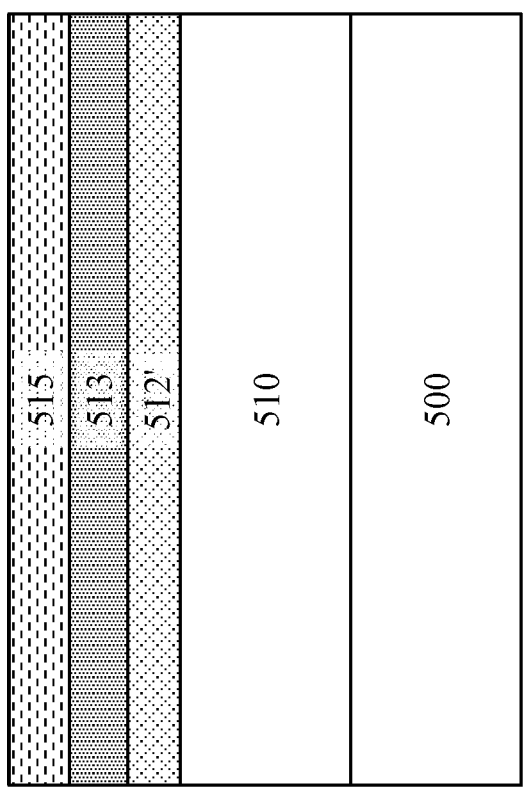
Figure 7C:
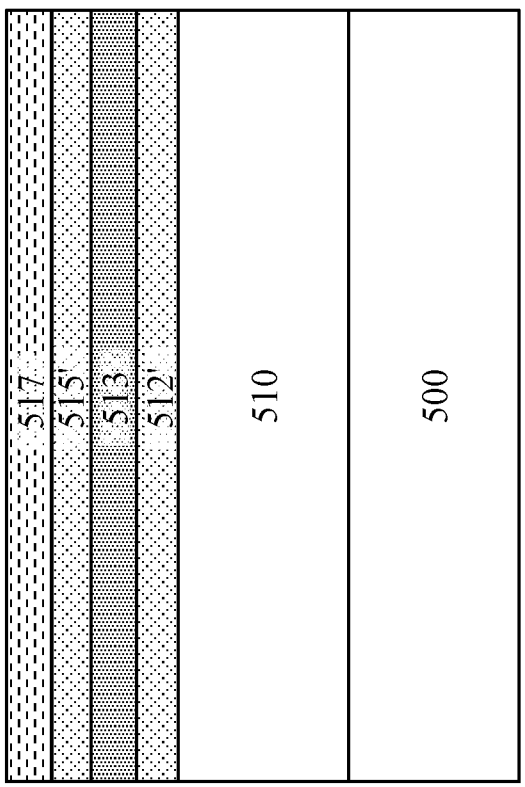

Other alternatives or embodiments may be used without departure from the spirit and scope of the present disclosure. FIGS. 7A to 7C are schematic drawings illustrating a memory element 200 of the semiconductor memory structure 20 at various fabrication stages subsequent to that illustrated in FIG. 5D according to aspects of the present disclosure in different embodiments. In some embodiments, a third film (i.e., the third metal oxide film 515') is formed on the second metal oxide film 513 before the formation of the second layer 516. The formation of the third film may be carried out in the same chamber as the formation of the first metal oxide film 512' and the formation of the second metal oxide film 513. For example, the formation of the third film may be carried out in the module 603.

Referring to FIG. 7A, after the second metal oxide film 513 is formed, the operation 404 is performed. A second metal film 515 is formed by sputtering a third target material. The second metal film 515 is formed over the second metal oxide film 513. In some embodiments, the first target material and the third target material are substantially the same. In some embodiments, the first target material and the third target material are different from the second target material. For example but not limited thereto, the third target material may include metal, such as magnesium.

Referring to FIG. 7B, the operation 405 is performed, a second oxygen treatment 52 is conducted to the second metal film 515 to form a third metal oxide film 515'. In some embodiments, the second oxygen treatment 52 oxidizes the second metal film 515 to form a third metal oxide film 515'. The oxygen gas is introduced in the second oxygen treatment 52 to form the third metal oxide film 515'. In some embodiments, the flow rate of the oxygen gas introduced in the second oxygen treatment 52 is within a range of approximately 100 sccm to 500 sccm. In some embodiments, the oxygen gas is introduced after the sputtering of the third target material. The growth mechanism of forming the third metal oxide film 515' differs from that of forming the first metal oxide film 512', thereby suppressing pinhole growth and mitigating the short rate issue.

In some embodiments, a composition of the third metal oxide film 515' and a composition of the first metal oxide film 512' may be substantially the same or different. In some embodiments, thicknesses of the first metal oxide film 512', the second metal oxide film 513 and the third metal oxide film 515' are substantially the same. In some embodiments, a sum of the thickness of the first metal oxide film 512' and the thickness of the third metal oxide film 515' is substantially same as the thickness of the second metal oxide film 513. In some embodiments, the thickness of the third metal oxide film 515' is substantially greater than the thickness of the first metal oxide film 512' and/or the thickness of the second metal oxide film 513.

In some embodiments, the annealing process is performed after the formation of the third metal oxide film 515'. The annealing process may facilitate a rearrangement of the oxygen atoms and the metal atoms in the first metal oxide film 512', the second metal oxide film 513 and the third metal oxide film 515'. After the annealing process is performed, the oxygen-to-metal ratios of the first metal oxide film 512', the second metal oxide film 513 and the third metal oxide film 515' are substantially the same. Thus, the first metal oxide film 512', the second metal oxide film 513 and the third metal oxide film 515' are merged to form the interlayer 514 as shown in FIG. 5E.

In some embodiments, the operation 406 may be performed after the formation of the third metal oxide film 515' and before the annealing process. Referring to FIG. 7C, a third metal film 517 is formed by sputtering a fourth target material. In some embodiments, the fourth target material and the third target material are substantially the same. In some embodiments, thicknesses of the first metal oxide film 512', the second metal oxide film 513, the third metal oxide film 515' and the third metal film 517 are substantially the same. In some embodiments, the annealing process is performed after the formation of the third metal film 517. The annealing process may facilitate a rearrangement of the oxygen atoms and the metal atoms in the first metal oxide film 512', the second metal oxide film 513, the third metal oxide film 515' and the third metal film 517. After the annealing process is performed, the first metal oxide film 512', the second metal oxide film 513, the third metal oxide film 515' and the third metal film 517 are merged to form the interlayer 514 as shown in FIG. 5E.

Figure 8:
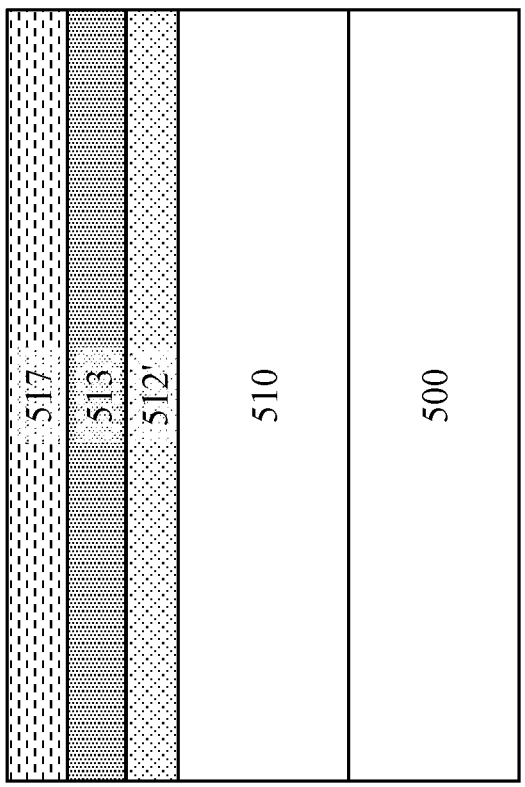
FIG. 8 is a schematic drawing illustrating a semiconductor memory structure at a fabrication stage subsequent to that illustrated in FIG. 5D according to aspects of the present disclosure in different embodiments.

FIG. 8 is a schematic drawing illustrating a memory element 200 of the semiconductor memory structure 20 at a fabrication stage subsequent to that illustrated in FIG. 5D according to aspects of the present disclosure in different embodiments. In some embodiments, the operation 406 may be performed after the formation of the second metal oxide film 513 and before the annealing process. A third metal film 517 is formed by sputtering a fourth target material. In some embodiments, the fourth target material and the first target material are substantially the same. In some embodiments, thicknesses of the first metal oxide film 512', the second metal oxide film 513 and the third metal film 517 are substantially the same. In some embodiments, the annealing process is performed after the formation of the third metal film 517. The annealing process may facilitate a rearrangement of the oxygen atoms and the metal atoms in the first metal oxide film 512', the second metal oxide film 513 and the third metal film 517. After the annealing process is performed, the first metal oxide film 512', the second metal oxide film 513' and the third metal film 517 are merged to form the interlayer 514 as shown in FIG. 5E.

FIGS. 9A to 9D are schematic drawings illustrating a memory element 200 of a semiconductor memory structure 20 at various fabrication stages subsequent to that illustrated in FIG. 5F according to aspects of the present disclosure in different embodiments. In some embodiments, another interlayer 540 is formed on the second layer 516. In some embodiments, the interlayer 540 over the second layer 516 can be the second interlayer 230 as shown in FIG. 2. In some embodiments, the interlayer 540 over the second layer 516 is formed by sputtering a fourth target material, and subsequently doping with the oxygen gas. In some embodiments, the interlayer 540 over the second layer 516 may be formed by operations similar to operations 401 and 402 and those illustrated in FIGS. 5B to 5C. In some embodiments, the interlayer 514 under the interlayer 540 may be formed by operations similar to those illustrated in FIGS. 7A to 7C or FIG. 8.

Figure 9B:
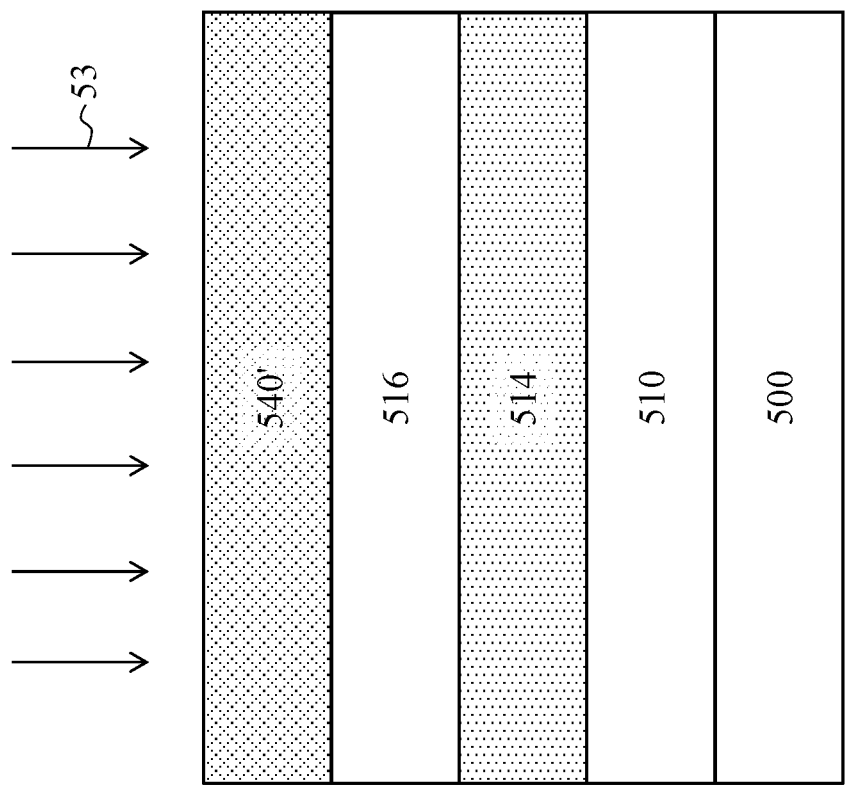
FIGS. 9A to 9D are schematic drawings illustrating a semiconductor memory structure at various fabrication stages subsequent to that illustrated in FIG. 5F according to aspects of the present disclosure in different embodiments.
Figure 9A:
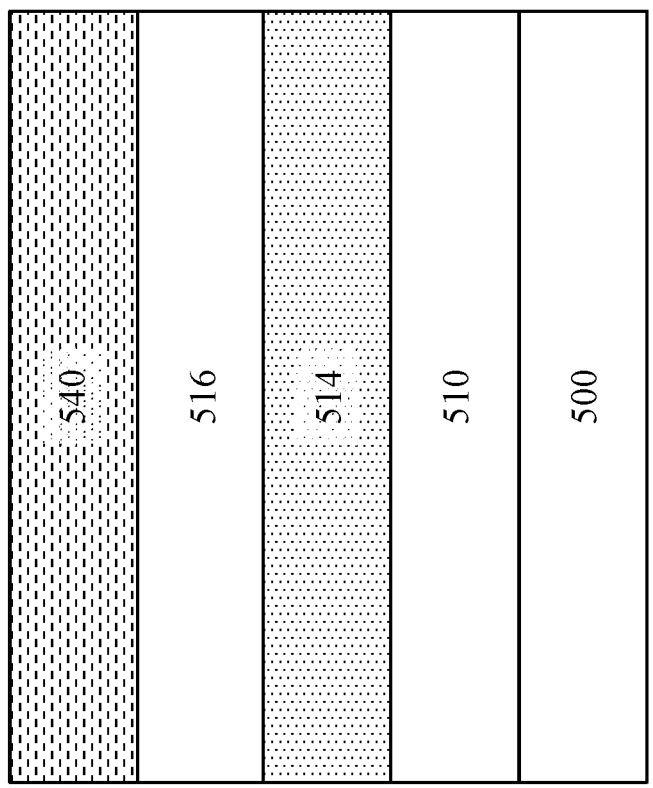

Referring to FIG. 9A, a fifth target material is sputtered to form a fourth metal film 540 over the second layer 516. In some embodiments, the fifth target material is sputtered by a DC sputtering process. In some embodiments, the fifth target material and the first target material are substantially the same. For example but not limited thereto, the fifth target material may include metal, such as magnesium.

Referring to FIG. 9B, a third oxygen treatment 53 is conducted to the fourth metal film 540 to form a fifth metal oxide film 540'. The oxygen gas is introduced in the third oxygen treatment 53 to react with the fourth metal film 540 and form a fifth metal oxide film 540'. The fifth metal oxide film 540' may be referred to as the interlayer 540'. In some embodiments, the oxygen gas may be introduced after the sputtering of the fifth target material. In some embodiments, the introduced oxygen gas reacts with the active metal in the fourth metal film 540, thereby reducing the amount of the active metal at the interface between the second layer 516 and the fifth metal oxide film 540'. Accordingly, the short rate issue can be mitigated. In some embodiments, thicknesses of the interlayer 540' and the interlayer 514 are substantially the same. In some embodiments, the thickness of the interlayer 514 is substantially greater than the thickness of the interlayer 540'.

The third oxygen treatment may be a light oxygen treatment or a heavy oxygen treatment. In some embodiments, the duration of the third oxygen treatment 53 is within a range of approximately 10 seconds to approximately 50 seconds. In some embodiments, the flow rate of the oxygen gas of the third oxygen treatment 53 is within a range of approximately 1 sccm to 10 sccm.

Figure 9D:
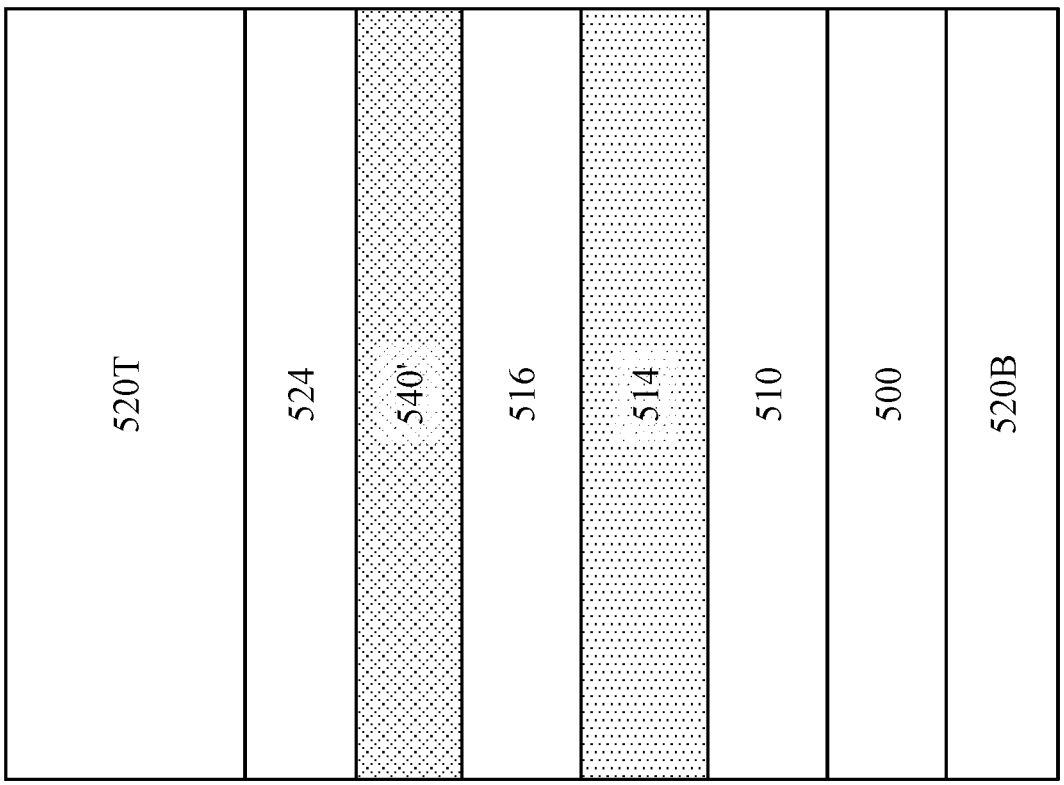
Figure 9C:
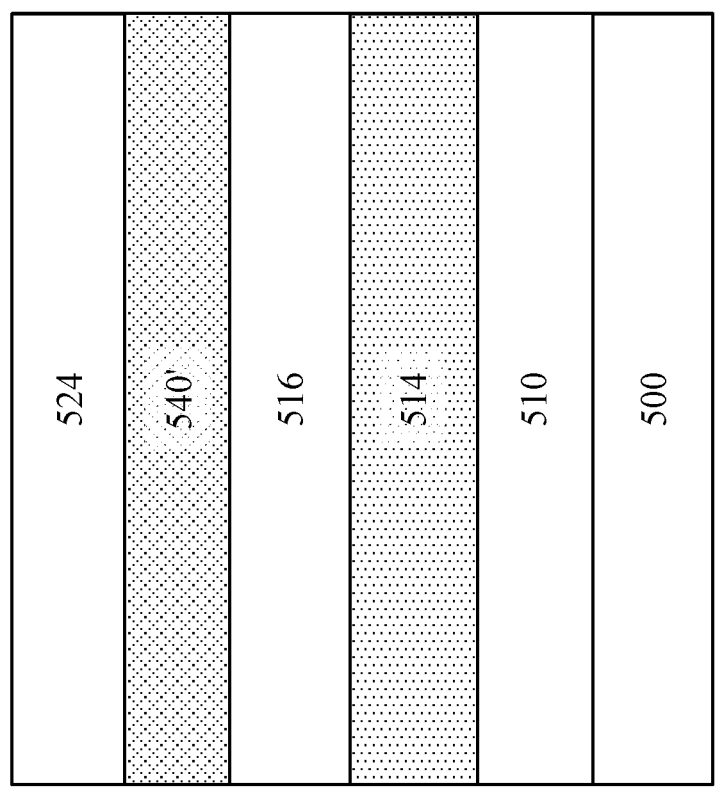

Referring to FIG. 9C, a cap layer 524 is formed over the interlayer 540'. In some embodiments, the cap layer 524 over the interlayer 540' can be the cap layer 232 as shown in FIG. 2. The cap layer 524 may be a multilayered structure. In some embodiments, the cap layer 524 may include a ferromagnetic layer. In some embodiments, the presence of the interlayer 540' may provide a longer data retention.

Referring to FIG. 9D, a bottom conductive layer 520B may be formed prior to the formation of the base layer 500. Further, a top conductive layer 520T may be sequentially formed on the interlayer 540'. In some embodiments, a patterned hard mask (not shown) is formed over the stacked layers (i.e., the stack of layers from the bottom conductive layer 520B to the top conductive layer 520T). The stacked layers may be etched through the patterned hard mask to form the memory element 200 of the semiconductor memory structure 20 as shown in FIG. 2, including the patterned bottom conductive layer 520B serving as the bottom electrode 210B, the patterned top conductive layer 520T serving as the top electrode 210T, and the patterned layers 500, 510, 514, 516, 540' and 524 serving as the memory element 200.

The present disclosure provides a method for forming a semiconductor memory structure. In some embodiments, the present disclosure provides a method for forming an interlayer of an MTJ element. In some embodiments, the present disclosure provides a method for forming a TBL of an MTJ element. A metallic film is formed over a ferromagnetic film by a DC sputter-deposition followed by a light oxygen treatment. The metallic film is preferably continuous in order to create a metal/metal interface with the underlying ferromagnetic film, thereby ensuring good adhesion and prevent the underlying ferromagnetic film from oxygen penetration, thereby maintaining the designed magnetic moment of the reference layer. The light oxygen treatment ensures an integrated formation of the TBL with a preferred stoichiometric ratio of oxygen to metal, thereby enhancing the PMA of the reference layer, minimizing the pinhole density of the TBL, and increasing the TMR ratio of the MTJ stack.

In some embodiments, a method for forming a semiconductor memory structure is provided. The method includes following operations. An interlayer is formed over a first ferromagnetic layer, wherein forming the interlayer includes following operations. A first metal film is formed by sputtering a first target material. A first oxygen treatment is conducted to the first metal film to form a first metal oxide film. A second metal oxide film is formed over the first metal oxide film by sputtering a second target material different from the first target material. A second metal film is formed by sputtering a third target material. A second oxygen treatment is conducted to the second metal film to form a third metal oxide film.

In some embodiments, a method for forming a semiconductor memory structure is provided. The method includes following operations. A first film is formed over a first ferromagnetic layer by sputtering a first target material and introducing an oxygen gas. A second film is formed over the first film by sputtering a second target material. A third film is formed over the second film by sputtering a third target material and introducing the oxygen gas. The first film, the second film and the third film are annealed to form an interlayer over the first ferromagnetic layer.

In some embodiments, a method for forming a semiconductor memory structure is provided. The method includes following operations. A first interlayer is formed over a first ferromagnetic layer, wherein forming the first interlayer includes following operations. A first film is formed by DC sputtering a first target material and introducing an oxygen gas. A second film is formed by RF sputtering a second target material, wherein the second target material is different from the first target material. A second ferromagnetic layer is formed over the first interlayer, wherein forming the second interlayer includes following operations. A third film is formed by DC sputtering a third target material and introducing the oxygen gas. A fourth film is formed by RF sputtering a fourth target material, wherein the fourth target material is different from the third target material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A method for forming a semiconductor memory structure, comprising:
    forming an interlayer over a first ferromagnetic layer, wherein forming the interlayer comprises:
        sputtering a first target material to form a first metal film;
        conducting a first oxygen treatment to the first metal film to form a first metal oxide film;
        radio-frequency (RF) sputtering a second target material different from the first target material to form a second metal oxide film over the first metal oxide film, wherein a growth mechanism of forming the second metal oxide film differs from that of forming the first metal oxide film;
        sputtering a third target material to form a second metal film; and
        conducting a second oxygen treatment to the second metal film to form a third metal oxide film; and
    forming a cap layer over the interlayer, wherein the cap layer includes a multilayered structure comprising a Co—Fe—B film, a first ruthenium (Ru) film, a tantalum (Ta) film and a second Ru film.

2. The method of claim 1, wherein the first target material and the third target material are the same.

3. The method of claim 1, wherein a flow rate of the first oxygen treatment is different from a flow rate of the second oxygen treatment.

4. The method of claim 3, wherein the flow rate of the second oxygen treatment is greater than the flow rate of the first oxygen treatment.

5. The method of claim 1, further comprising:
    annealing the first metal oxide film, the second metal oxide film and the third metal oxide film to form the interlayer.

6. The method of claim 1, wherein elements of the first metal oxide film are same as elements of the second metal oxide film.

7. The method of claim 1, further comprising forming a second ferromagnetic layer over the interlayer.

8. The method of claim 7, wherein the second ferromagnetic layer is formed prior to the formation of the cap layer.

9. A method for forming a semiconductor memory structure, comprising:
    forming a first film over a first ferromagnetic layer by sputtering a first target material and introducing an oxygen gas;
    forming a second film over the first film by sputtering a second target material;
    forming a third film over the second film by sputtering a third target material and introducing the oxygen gas;
    annealing the first film, the second film and the third film to form an interlayer over the first ferromagnetic layer, wherein the annealing is performed immediately after the formation of the third film; and
    forming a cap layer over the interlayer, wherein the cap layer includes a multilayered structure comprising a Co—Fe—B film, a first ruthenium (Ru) film, a tantalum (Ta) film and a second Ru film.

10. The method of claim 9, wherein the first target material and the third target material are the same.

11. The method of claim 9, wherein the first target material and the third target material are different from the second target material.

12. The method of claim 9, further comprising forming a second ferromagnetic layer over the interlayer.

13. The method of claim 12, wherein the second ferromagnetic layer is formed after the annealing.

14. The method of claim 12, wherein the cap layer is formed over the second ferromagnetic layer.

15. A method for forming a semiconductor memory structure, comprising:
    forming a first interlayer over a first ferromagnetic layer, wherein forming the first interlayer comprises:
        forming a first film by direct current (DC) sputtering a first target material and introducing an oxygen gas, wherein the introduced oxygen gas forms a metal-oxygen bond at the interface with the first ferromagnetic layer; and
        forming a second film by radio-frequency (RF) sputtering a second target material, wherein the second target material is different from the first target material;
    forming a second ferromagnetic layer over the first interlayer;
    forming a second interlayer over the second ferromagnetic layer, wherein forming the second interlayer comprises:
        forming a third film by DC sputtering a third target material and introducing the oxygen gas; and
        forming a fourth film by RF sputtering a fourth target material, wherein the fourth target material is different from the third target material; and
    forming a cap layer over the second interlayer, wherein the cap layer includes a multilayered structure comprising a Co—Fe—B film, a first ruthenium (Ru) film, a tantalum (Ta) film and a second Ru film.

16. The method of claim 15, wherein forming the first interlayer further comprises:
    forming a fifth film by DC sputtering a fifth target material, wherein the fifth target material and the first target material are the same.

17. The method of claim 15, wherein forming the second interlayer further comprises:
    forming a fifth film by DC sputtering a fifth target material, wherein the fifth target material and the third target material are the same.

18. The method of claim 15, wherein a composition of the first interlayer is different from a composition of the second interlayer.

19. The method of claim 15, wherein a thickness of the first interlayer is greater than a thickness of the second interlayer.

20. The method of claim 15, wherein the metal-oxygen bond includes a Fe—O bond.

\* \* \* \* \*